United States Patent
Traber

(10) Patent No.: US 6,771,372 B1
(45) Date of Patent: Aug. 3, 2004

(54) ROTATIONAL STAGE WITH VERTICAL AXIS ADJUSTMENT

(75) Inventor: Thomas Traber, Dublin, CA (US)

(73) Assignee: Therma-Wave, Inc., Fremont, CA (US)

( * ) Notice: Subject to any disclaimer, the term of this patent is extended or adjusted under 35 U.S.C. 154(b) by 52 days.

(21) Appl. No.: 10/178,623

(22) Filed: Jun. 24, 2002

Related U.S. Application Data

(60) Provisional application No. 60/336,530, filed on Nov. 1, 2001.

(51) Int. Cl.[7] .............................................. G01B 11/00
(52) U.S. Cl. ...................................... 356/399; 356/244
(58) Field of Search ............................... 356/399–401, 356/244

(56) References Cited

U.S. PATENT DOCUMENTS

| | | | | |
|---|---|---|---|---|
| 4,328,553 A | * | 5/1982 | Fredriksen et al. .... | 356/139.04 |
| 4,457,664 A | * | 7/1984 | Judell et al. ................. | 414/779 |
| 4,750,141 A | * | 6/1988 | Judell et al. .................. | 702/95 |
| 4,872,835 A | * | 10/1989 | Tullis et al. ................. | 432/225 |
| 5,066,131 A | * | 11/1991 | Iwata et al. .................. | 356/401 |
| 5,083,757 A | * | 1/1992 | Barsky ......................... | 267/181 |
| 5,182,615 A | * | 1/1993 | Kurosawa et al. .......... | 356/400 |
| 5,670,888 A | * | 9/1997 | Cheng .......................... | 324/754 |
| 5,906,860 A | * | 5/1999 | Motoda et al. .............. | 427/240 |
| 5,923,408 A | * | 7/1999 | Takabayashi ................ | 355/53 |
| 6,249,342 B1 | * | 6/2001 | Cheng ....................... | 356/237.2 |
| 2001/0036742 A1 | * | 11/2001 | Wytman ..................... | 438/712 |
| 2002/0021428 A1 | * | 2/2002 | Nakano et al. ............... | 355/53 |
| 2002/0159054 A1 | * | 10/2002 | Ebert et al. ................. | 356/244 |
| 2003/0003848 A1 | * | 1/2003 | Tobin .......................... | 451/11 |

FOREIGN PATENT DOCUMENTS

EP        1061558        * 12/2000

* cited by examiner

Primary Examiner—Hoa Q. Pham
(74) Attorney, Agent, or Firm—Stallman & Pollock LLP

(57) ABSTRACT

A stage system is disclosed for supporting and positioning a semiconductor wafer for inspection in an optical metrology device. A chuck for supporting a wafer is mounted to the stage system. The stage system can move the chuck along two linear orthogonal axes. A rotational stage is also provided for rotating the chuck. A mechanism is provided for adjusting the vertical position of a chuck to allow for focusing of the probe beam of the metrology device. The vertical adjustment mechanism is designed so that it does impede the rotational positioning of the chuck.

18 Claims, 9 Drawing Sheets

ROTATIONAL STAGE WITH VERTICAL AXIS ADJUSTMENT

PRIORITY INFORMATION

The present application claims the benefit of U.S. Provisional Application Serial No. 60/336,530, filed Nov. 1, 2001, ROTATIONAL STAGE WITH VERTICAL AXIS ADJUSTMENT, which is incorporated herein by reference.

FIELD OF INVENTION

The present invention relates to metrology tools with rotating stages having integrated z-axis adjustment for inspecting a wafer.

BACKGROUND

This invention relates to optical metrology tools of the type described in U.S. Pat. No. 6,278,519, incorporated herein by reference. Referring to prior art FIG. 1, these types of tools include a light source for generating a probe beam 7, which is focused onto a semiconductor wafer 4. Changes between the incident probe beam 7 and the reflected beam are monitored to evaluate characteristics of the sample 4.

Tools of this type typically include a motion stage for supporting the wafer 4. Various stage motion combinations are available including full X-Y stages; R/theta stages; and ½ X-½Y plus theta stages (where theta means 360 degrees of rotation). Prior art FIG. 1 exemplarily illustrates an X-stage 22, a Y-stage 24, and theta stage 26. The motion of the stages is computer controlled for moving the wafer into position with respect to the focused spot of the probe beam 7.

These tools also typically include a focusing (preferably autofocusing) system, which brings the wafer into the focal plane of the focusing optics of the measurement system 2. A number of these systems operate to translate the focusing optics in a vertical direction with respect to the sample. Alternatively, the stages themselves are provided with some form of vertical (z-axis) movement for focusing purposes. Since the motion system needs to be designed to fit within the available height 3, conventional Z-axis stages that utilize guide rails are difficult to integrate. The length of the profile moving along the guide rails directly affects the Z-axis' stiffness against tilting movement. Where the length of the moving profile is limited by the available height, the tilting movement of the moving parts becomes hard to control. In order to reduce the tilting movement, the contact pressure between the moving profile and the guide rails needs to be increased, which results in increased friction and consequently increased actuating forces. High friction and actuating forces again reduce the movement resolution in Z-axis.

Therefore, there exists a need for an apparatus and method for highly precise vertical micro adjustment of a rotating stage with minimal friction and a maximum stiffness against tilt movement and lateral movement.

Conventional linear guiding systems define the movement direction by either a sliding or a rolling contact. This is feasible where an extensive movement range needs to be covered. In this application, the required Z-axis movement range is only twenty thousandths of an inch. Providing Z-axis movement over that small a range with sliding or rolling guides still requires a relatively bulky and heavy assembly, which increases the moment of inertia of the motion system. As a consequence, the motion system moves more slowly.

Therefore, there exists a need for a Z-axis guiding system that is low in mass as well.

SUMMARY

A wafer motion system includes one or two conventional linear stages and a rotating stage, which are mounted on top of each other. The one or two linear axes are horizontal. The rotating stage is placed at the top and is configured for holding a wafer and rotating it around a vertical axis of revolution. The one or two linear stages have a travel range defined in combination with the rotating stage to position the wafer with respect to the probe beam. The wafer is placed on a chuck and held down by a vacuum provided between wafer and chuck.

The chuck itself is guided along the axis of revolution within the rotating stage. Specifically configured and placed flexures or membranes elastically guide the chuck without any substantial friction. The membranes easily deflect in the vertical direction while being highly rigid in horizontal direction. Preferably, at least two ring shaped membranes are vertically positioned relative to each other. The horizontal stiffness of each membrane in combination with the vertical offset between them results in a high stiffness against tilt.

The rotationally symmetric design of the membranes allows them to be easily integrated into the generally rotationally symmetric design of the rotating stage. The relatively small mounting space required for mounting the membranes results in little additional volume and mass necessary for integrating the membrane rings in the rotating portion of the rotating stage.

The membranes provide a substantially friction free guidance of the chuck allowing for a smooth and precise actuation and adjustment. A horizontally oriented piezo stack is utilized to provide the vertical actuation of the chuck via a lever system, which amplifies and transforms the horizontal expansion of the piezo stack into a vertical movement of the required range. The vertical lever movement is transmitted to the chuck unit via a central linking assembly, which provides for initial adjustment and preload of the actuator to the chuck. The linking assembly also receives external vacuum and/or pressure air and transmits it into the chuck unit.

The vertical movement system is actuated by a voltage applied to the piezo stack, which expands in accordance to the well-known principles of piezo elements. The amount of horizontal piezo stack movement is in the micron range. The lever system amplifies the piezo movement by a factor of approximately 15.

DETAILED DESCRIPTION OF THE INVENTION

Figure 1:
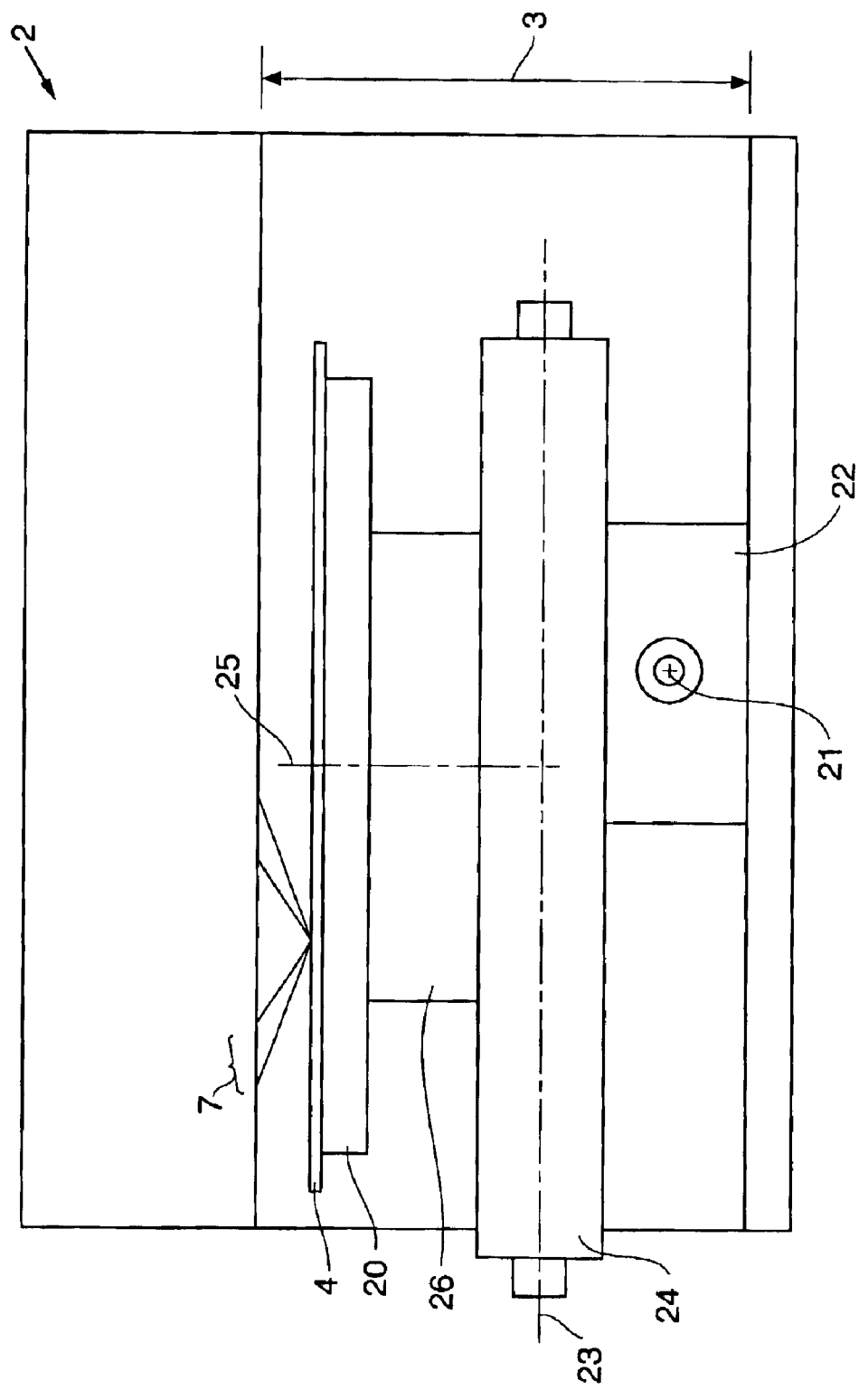
FIG. 1 schematically shows a metrology tool of the prior art.

FIG. 1 generally illustrates a wafer support and movement system 2 in which the subject invention can be incorporated. The system 2 is of the type that would be incorporated in a metrology tool for optically inspecting semiconductor wafers. Such metrology tools are described, for example, in U.S. Pat. Nos. 6,278,519 and 5,608,526, the disclosures of which are incorporated herein by reference. Such tools are capable of performing various measurements including spectroscopic reflectometry and spectroscopic ellipsometry.

In such metrology tools, a probe beam 7 is focused onto the sample surface. The reflected probe beam is monitored to evaluate characteristics of the sample. In these systems it is important to accurately focus the probe beam on the sample. In some systems, focusing is achieved by moving the optics within system 2. (not shown). In others, focusing is achieved by moving the stage system supporting the wafer in the Z-axis perpendicular to the sample surface. The subject invention is intended to permit focusing by Z-axis movement of the stage. The mechanism for providing such Z-axis motion, while allowing complete 360 degrees of rotation of the wafer will be discussed below.

As seen in FIG. 1, the stage system can include linear stages 22, 24 and a rotating stage 26. The first linear stage 22 provides movement along a linear axis 21 perpendicular to the view plane of FIG. 1. On top of the first stage 22 is mounted the second stage 24 moving along a linear axis 23. On top of the second stage is mounted the rotating stage 26 rotating around an axis of revolution 25. The present invention introduces a Z-axis motion system that is preferably integrated in the rotating stage 26, while permitting a full 360-degrees of rotation of the rotating stage 26. It is noted that the scope of the invention is not limited by a specific configuration and/or number of stages. The detailed configuration and operation of the inventive Z-axis motion system is described in the following.

Figure 2:
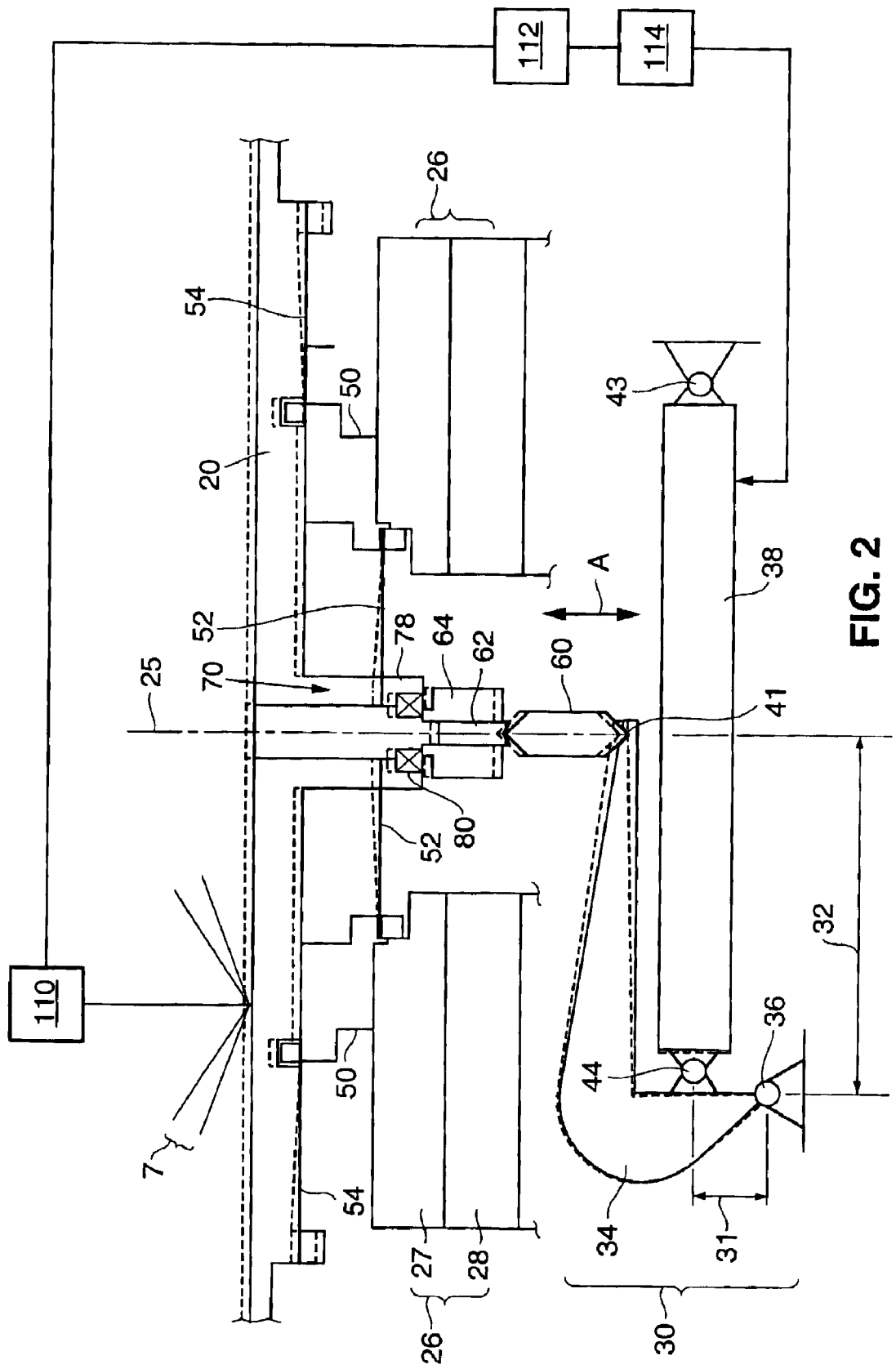
FIG. 2 schematically illustrates the function of the present invention
Figure 3:
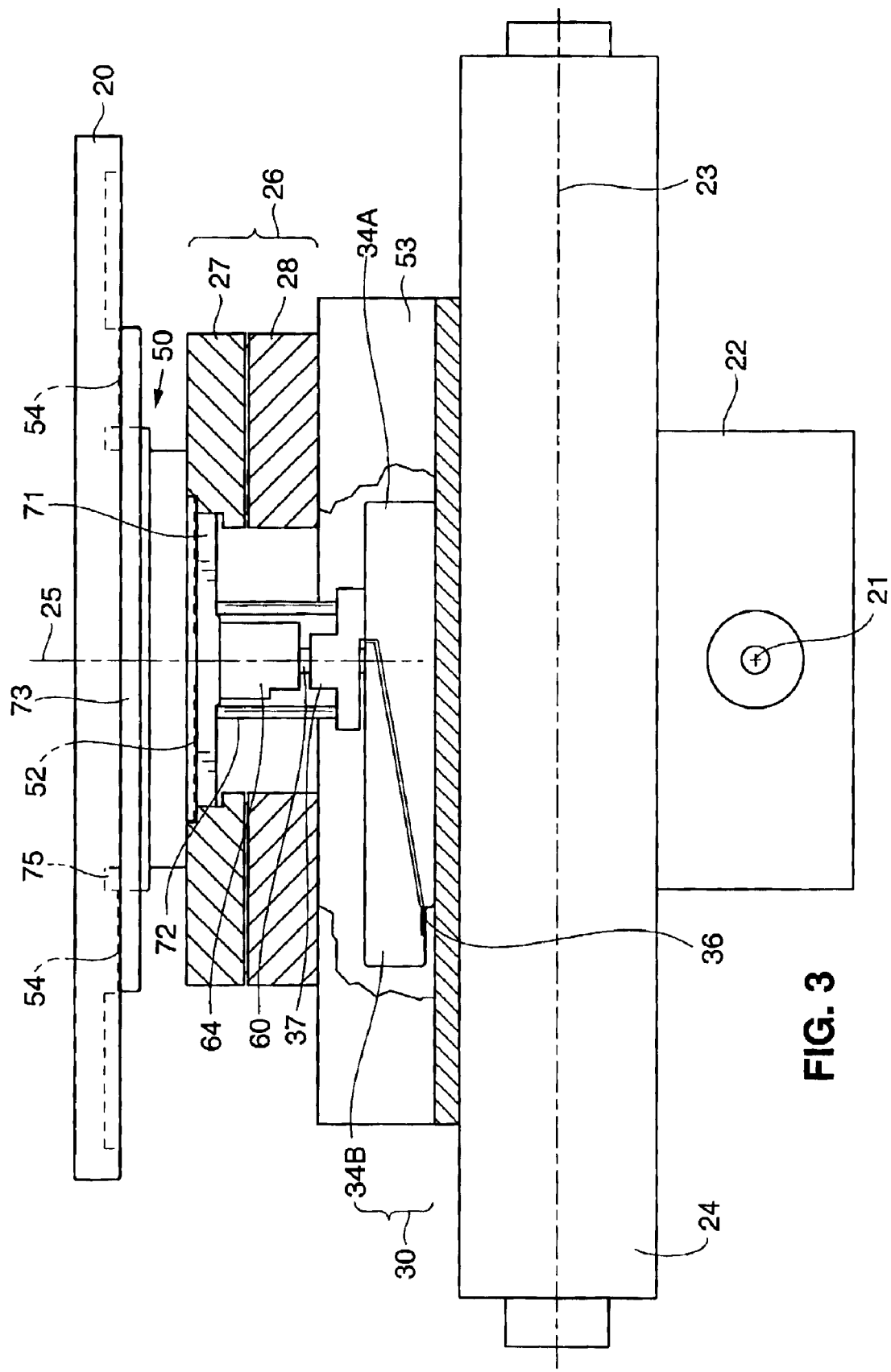
FIG. 3 shows a simplified front view of a stage system having a z-axis motion system in accordance with the present invention.
Figure 4:
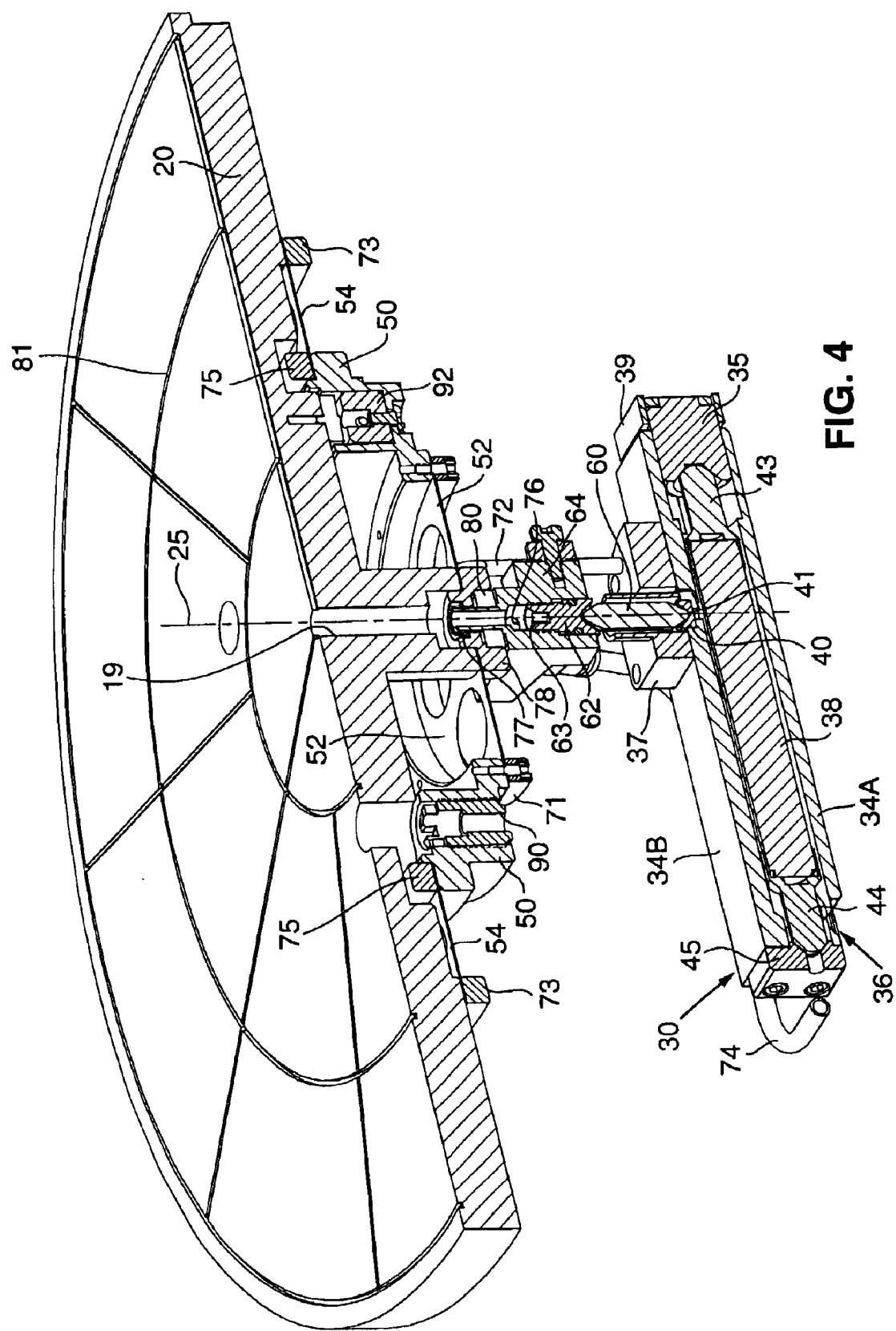
FIG. 4 is a perspective view, partially in section, of the subject assembly.
Figure 5:
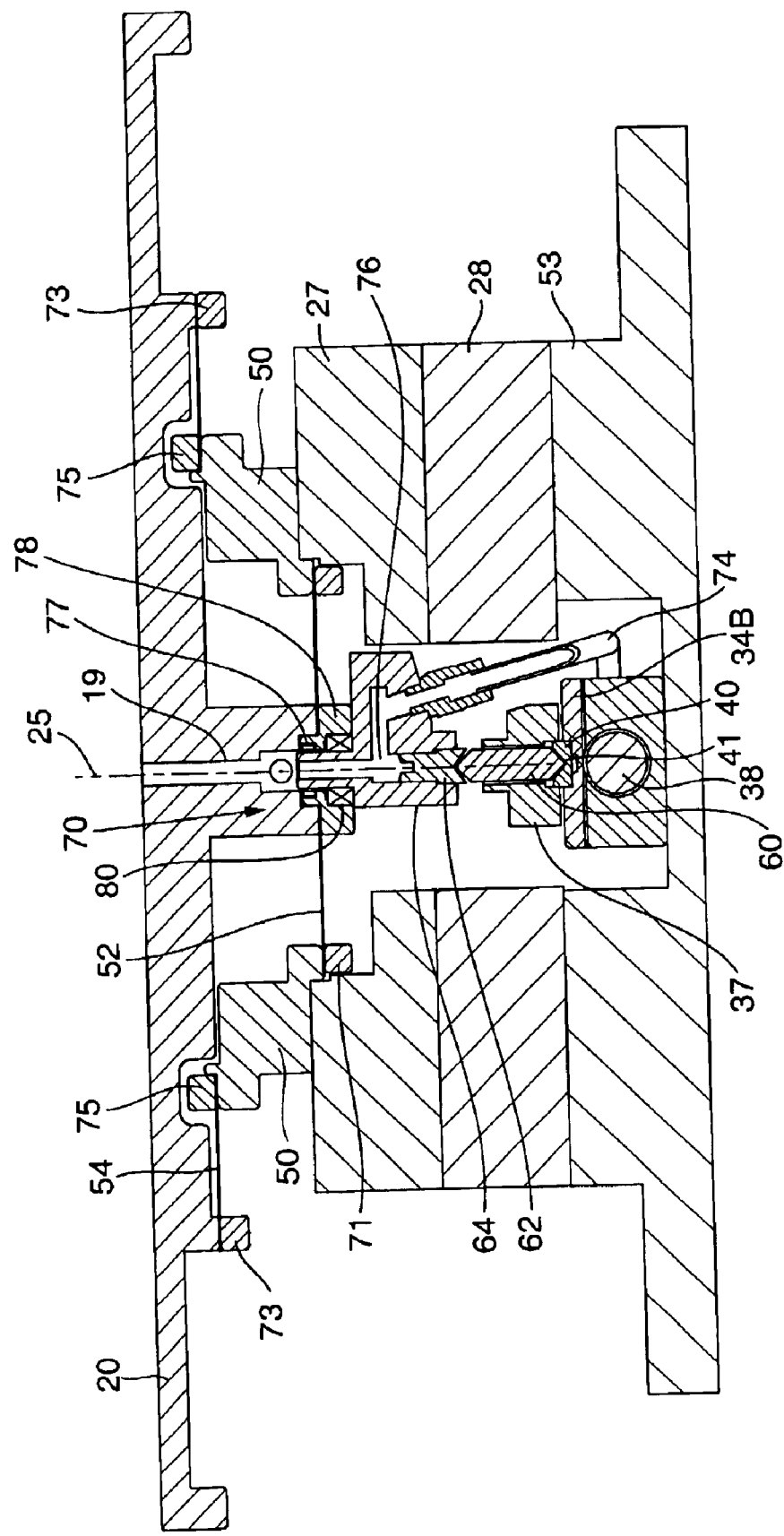
FIG. 5 shows a simplified section view of the rotating stage in a view direction perpendicular to the view direction of FIG. 3.

FIGS. 2 to 9 illustrate features of the invention. FIG. 2 is the most simplified schematic which is useful for illustrating the mechanical Z-axis operation of the system. FIGS. 3 and 5 are also somewhat simplified to illustrate the overall structure. FIGS. 4 and 6 to 9 illustrate specific details of the construction of the preferred embodiment.

As seen in these Figures, an actuator, illustrated generally as 30, is provided for controlling the vertical movement of the chuck 20 which supports the wafer 4. The vertical movement is indicated by the arrow A. The actuator acts via cup 40 directly on push rod 60 which is preferably substantially coincident with the axis of revolution 25 of the chuck (which is co-axial with the axis of the rotary stage 26). The vertical movement is transmitted from the push rod 60 via adjustor 62, coupling body 64, and a bearing 80 onto the central element 70, which is attached to a chuck 20. The chuck 20 is attached to and coupled with the base 50 via a flexure 54. The central element 70 is attached to and coupled with the base 50 via a flexure 52. The central element includes channel 19 which transmits vacuum received through bore 76 in coupling body 64 to grooves 81 in the chuck 20 for holding the wafer in place during measurement.

The flexures 52, 54 hold the chuck 20 together with the central element 70 and any other attached elements substantially rigid against lateral movement and/or tilt movement with respect to base 50. Only movement in vertical direction along the axis of revolution 25 is provided. The scope of the invention includes embodiments, where the central element 70 and the chuck 20 are one piece or separate pieces mechanically connected to one another.

The base 50 is attached onto a rotating portion 27 of the stage 26. Rotational movement induced by the rotating stage 26 is transmitted via the base 50 and the flexures 52, 54 onto the central element 70 and the chuck 20. The non-rotating portions 28 and 53 of the stage 26 is affixed on the linear stage 24 as is shown in FIGS. 1 and 3. Rotational movement is decoupled from the elements 60, 62, and 64 by the bearing 80.

In the preferred embodiment, the flexures 52, 54 are concentrically arranged with respect to the axis of revolution 25. Each of the flexures 52, 54 provide rigidity against lateral movement. The concentric and vertically offset arrangement of the flexures 52, 54 combines the lateral stiffness of each of the flexure 52, 54 advantageously to make the chuck 20 and the central element 70 additionally highly stiff against tilt movement and provides for a highly precise linear movement performed by the chuck 20 in direction along the axis of revolution 25.

The actuator 30 includes a PZT stack translator 38 to which members 43 and 44 are attached. Members 43 and 44 have spherical ends (and are shown as balls in FIG. 2). The lever 34 of the actuator is a single piece incorporating a stationary base section 34A and a rotating lever section 34B connected by a thin hinge element 36. One end of the PZT stack translator is held rigid against the base section of the lever 34B via member 43, adjusting screw 35 and clamping plate 39. The opposite end of the PZT stack translator contacts the lever section of the lever 34B via member 44, and retainer plate 45.

The PZT stack 38 is a well known horizontally stacked number of piezo elements. Increasing the voltage applied to the PZT stack 38 causes it to expand; decreasing the applied voltage causes the PZT to contract. The expansion movement of the PZT stack 38 is transmitted via the member 44 onto the lever 34B, which transforms the horizontal movement into an angular movement around the fixed hinge 36, while at the same time amplifying it by a factor of approximately 15. Consequently, the point of contact 41 moves upward. The lever 34B thereby redirects the horizontal expansion movement of the PZT stack 38 into a vertical movement suitable for Z-axis adjustment of the chuck 20 and a wafer 4. The upward positioning of the chuck and the bending motion of the flexures is shown in phantom line in FIG. 2.

The expansion range of the PZT stack 38 is approximately 33 microns and the angular movement of the lever 34B is 0.30 degrees, such that the point of contact 41 moves off-axis of the rotary stage and chuck. This misalignment is allowed and absorbed by the cup 40 and links 60 and 62, which has a ball and socket joint at each end.

The lever 34B serves to amplify the expansion of the PZT stack 38 by a factor that is essentially defined by the proportion between distance 31 and 32. Distance 31 is between hinges 36 and 44. Distance 32 is between 36 and 41. In the preferred embodiment, the amplification is approximately 15 times the expansion of the PZT stack 38. The movement amplification and redirection introduced by the lever 34B provides for sufficient design space for the PZT stack 38 without compromising the overall height of the motion system. In the preferred embodiment, the PZT stack has a diameter of ⅜ of an inch and a length of about three inches.

The PZT stack 38 expands proportionally in response to the applied voltage. In practice, it is difficult to control height directly based on the applied voltage due to friction and and/or deformation along the movement path between the PZT stack 38 and the chuck 20. Therefore, in the preferred embodiment, the vertical positioning is controlled by a feed back system wherein the vertical height of the wafer is monitored with a focusing mechanism 110 above the wafer. Errors in focusing are monitored and used is a feedback loop to the voltage controlling the PZT stack. In the preferred embodiment, the focus system 110 provides a signal that is processed by a processor 112 into a second signal, which is transformed preferably by a linear variable differential transformer 114 (LVDT) into a voltage applied to the PZT stack 38. It is clear to one of ordinary skills in the art, that any device for precise distance or position measurement may be utilized instead or in addition to the auto focus system 11.

To initially setup the vertical position of the chuck 20, adjustor 62 may be threaded in or out of the push rod 60, which lowers or lifts the chuck 20. Adjustor 62 is seated and held in coupling body 64, the detailed function of which will be explained with respect to FIGS. 4 and 5.

As seen in FIG. 4, the lever 34B is preferably configured as a partly separated portion of an enclosure 34A–34B enclosing the PZT stack 38. The enclosure 34A–34B has a central cavity configured to encapsulate the PZT stack 38 and the elements 43, 44. The hinge 36 is preferably configured as a membrane that bridges the fixed portion. 34A of the enclosure with the moveable portion 34B. The membrane hinge 36 is sufficiently flexible to absorb the angular movement of the lever 34B. A frame 37 is mounted on the enclosure and hold anti-rotation pins 72 (see also FIGS. 4 and 7). Pins 72 keep the elements 60, 62, and 64 aligned and non-rotating.

In the preferred embodiment, the PZT stack 38 is biased at a central voltage value, which is defined as the mid-range or central z-axis position of the chuck at which the flexures 52, 54 may be in a neutral non deflected state. By increasing or decreasing the voltage to the PZT stack 38, the chuck 20 can be raised or lowered. This is compensated by the flexures 52, 54 by bending with their inner portion upwards or downwards. In the preferred embodiment, the chuck can be moved±ten thousandths of an inch. The flexures 52, 54 are configured to absorb this vertical movement well within their elastic deformation range. The chuck 20 is pre-loaded via springs (not shown) vertically downward relative to the base 50. This ensures that, as the PZT stack expands and contracts as a result of the varying the applied voltage, intimate mechanical contact is maintained through parts 34B, 41, 60, 62, 64, 80, 78, (52) and 20. The movement can be used to focus the probe beam of light onto the wafer 4.

One important aspect of this invention is that the structure allows the chuck 20 to be rotated by 360 degrees. Bearing 80 serves thereby to transfer the upward thrust forces while at the same time minimizing friction torque and eliminating surface-to-surface rubbing during rotation. The pins 72 prevent push rod 60 and coupling 64 from being rotated by the torque resulting from the remaining friction in the bearing 80. In this manner, hose 74 (see FIG. 5) does not become wrapped around the mechanism when the stage 26 is rotating. Adjustment clement 62 is threaded and can be rotated with a tool inserted into the hex recess 63 at the top of element 62 to vary its vertical position. The hex recess 63 is accessible through the top of chuck 20 and the central bore 19. Adjustor 62 is used in the initial set up to adjust the height of the system and compensate for tolerances. Coupling body 64 is connected to a source of vacuum delivered by hose 74 (see FIG. 5 and 7). Through opening 76 the fluid flow communicates to the bore 19.

Figure 6:
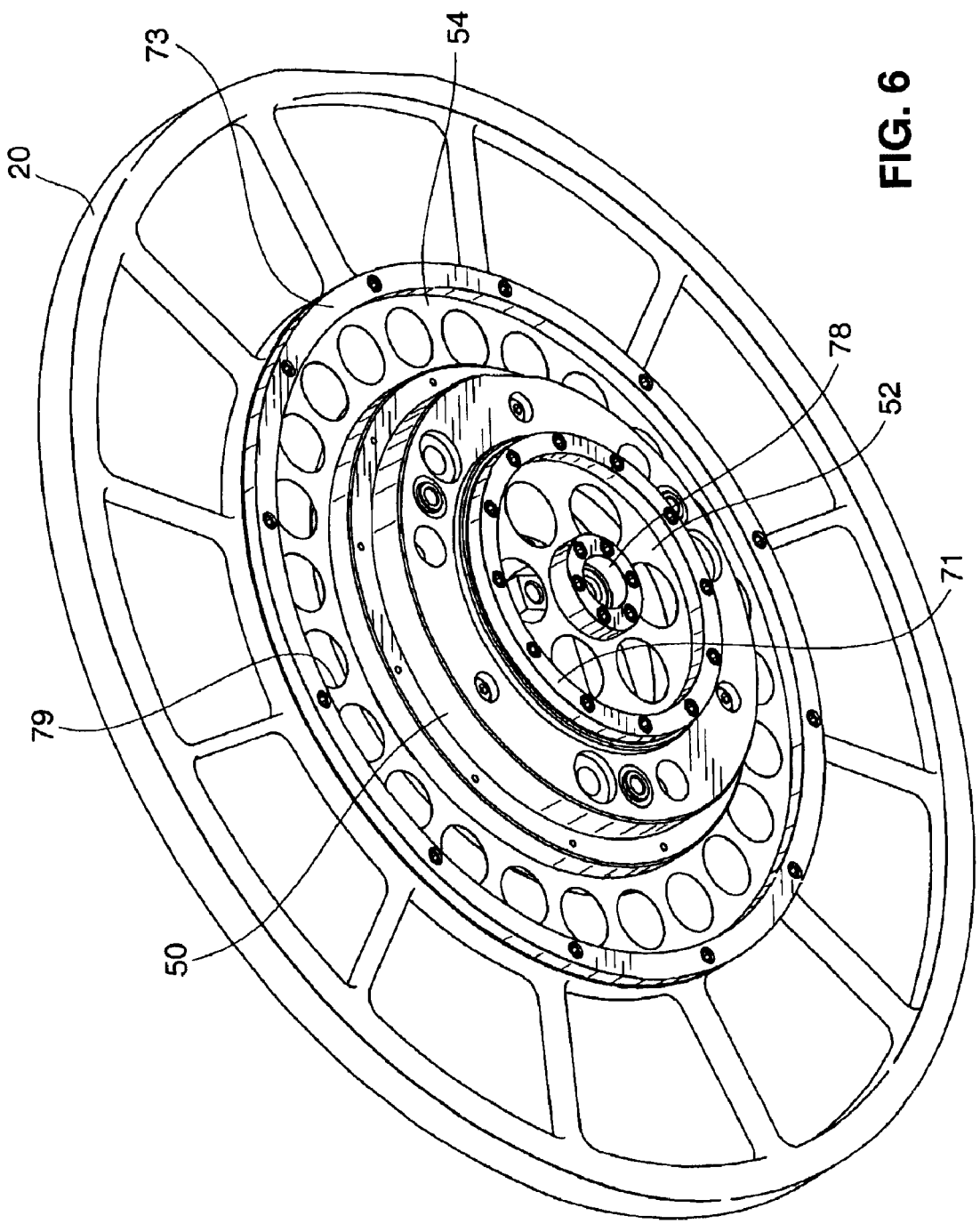
FIG. 6 shows a perspective bottom view including the assembled chuck, flexures and base.
Figure 7:
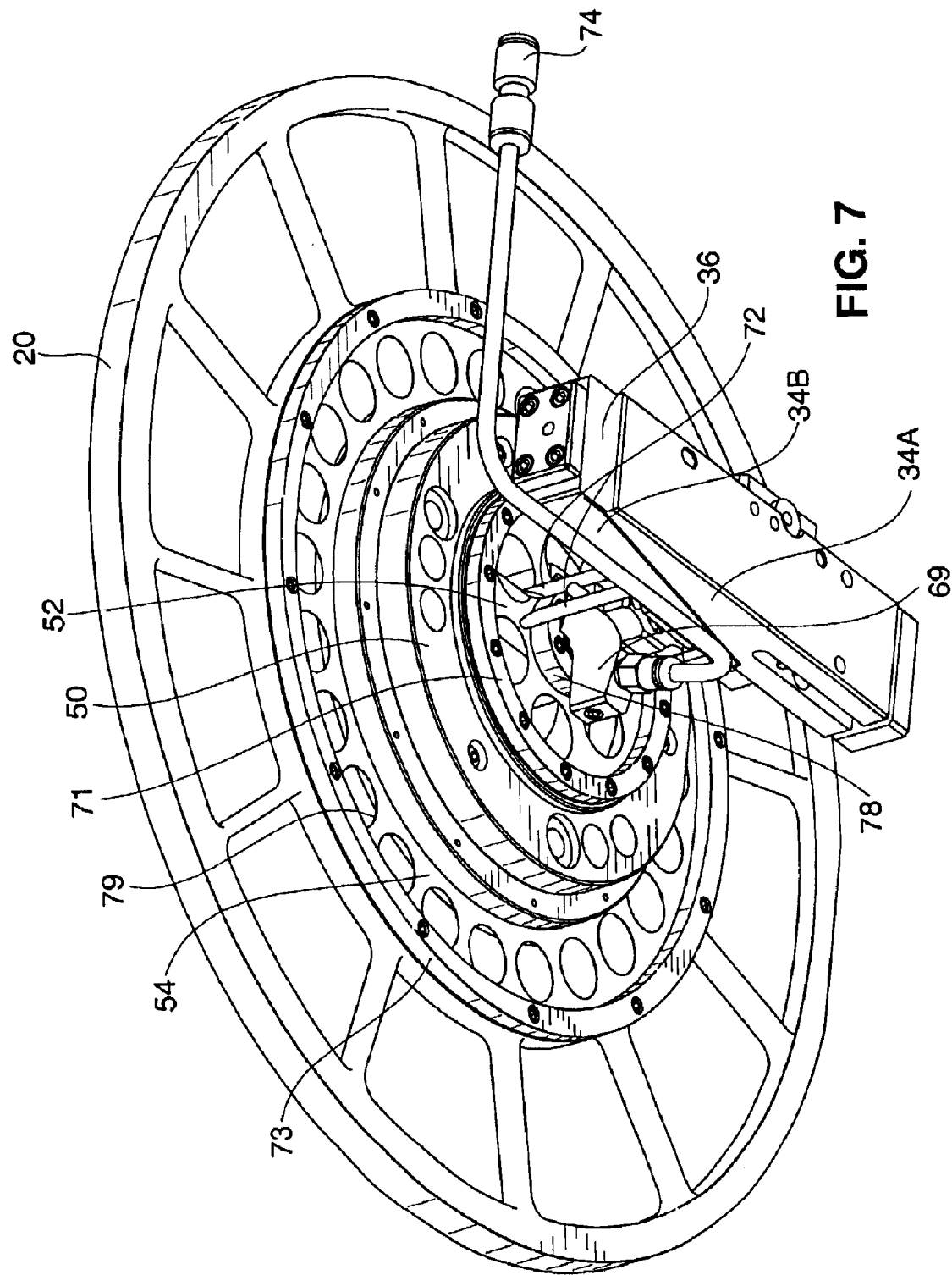
FIG. 7 shows a perspective bottom view including the chuck, the flexures and the z-axis motion system.
Figure 8:
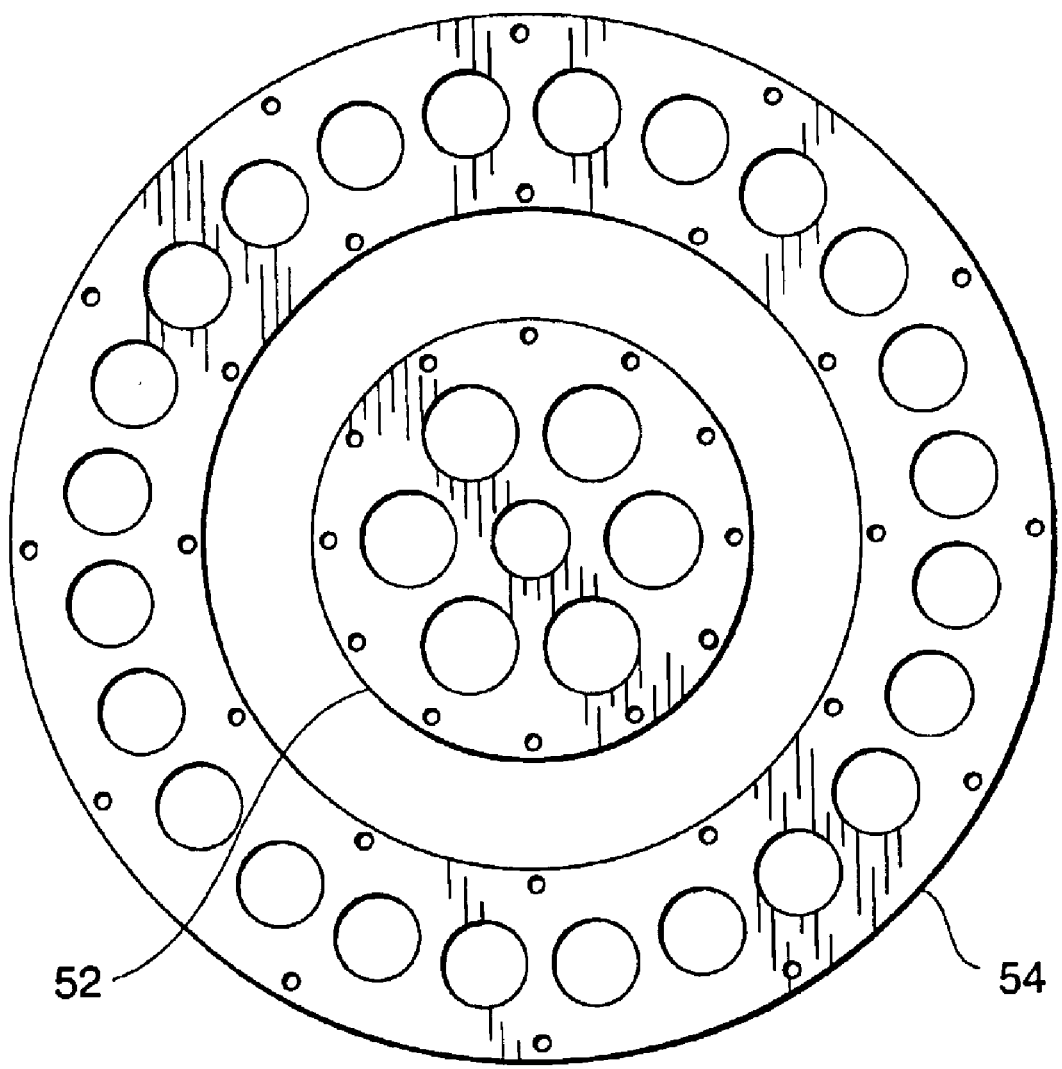
FIG. 8 shows two exemplary flexures of the preferred embodiment in concentric arrangement as assembled for operation.
Figure 9:
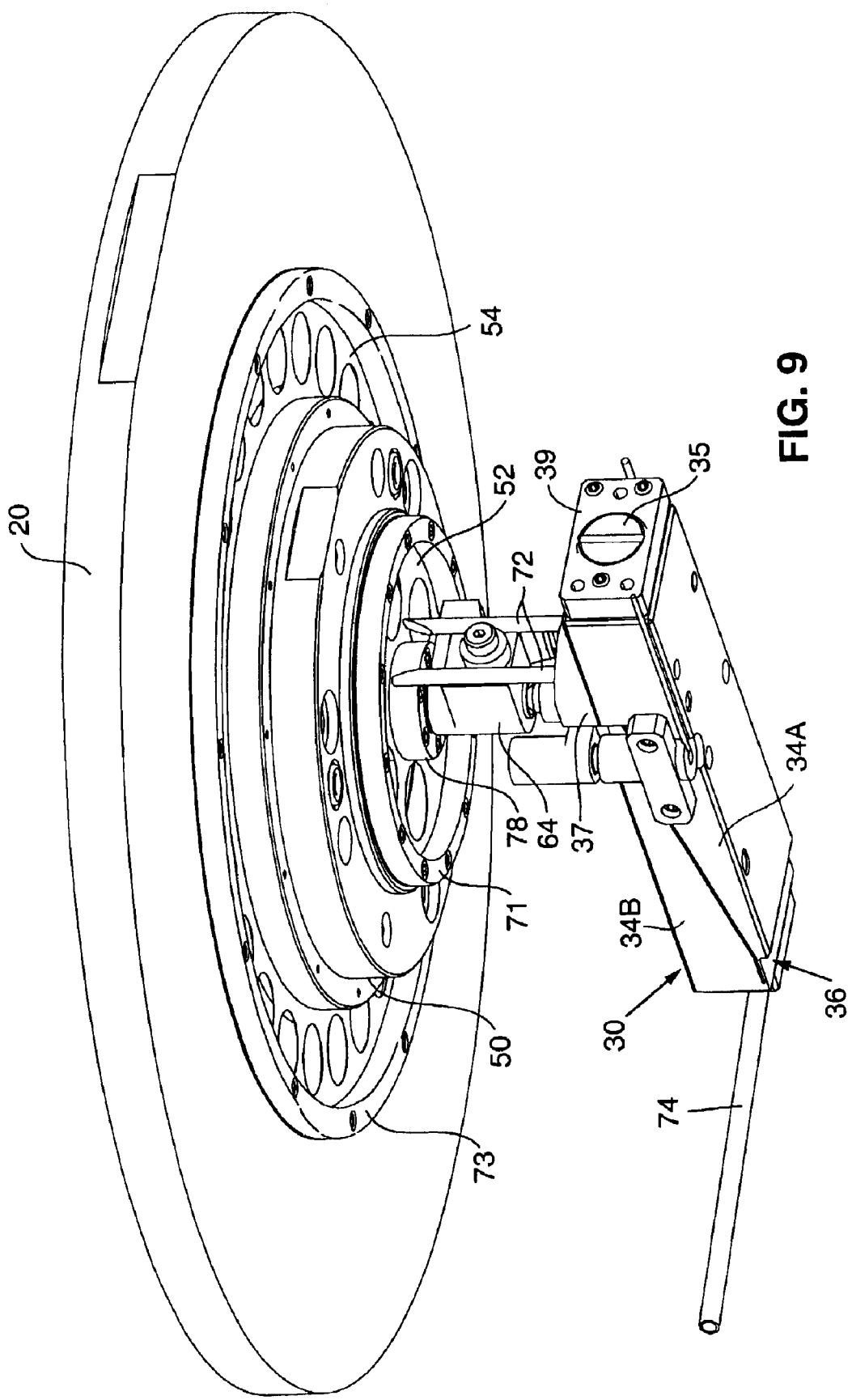
FIG. 9 shows lower a perspective bottom view including the chuck, the flexures and the z-axis motion system.

In FIGS. 6 and 7, the flexures 52, 54 are visible in their assembled position. The flexures 52, 54 are preferably configured as thin membranes made, for example, from full hard stainless steel with a thickness 0.004 inch. Such membranes may feature circular perforations 79 (see FIGS. 6, 7 and 8) to reduce resistive axial forces resulting from their elastic deformation. In the preferred embodiment, the flexures 52, 54 have an annular width of approximately 1.25 inch. The width is defined as the difference between the outside diameter and inside diameter of the flexures 52, 54. FIG. 8 shows in that context two exemplary flexures 52, 54. The hole pattern along their inside and outside edges correspond to the screw holes of the clamping rings 73, 75 for the flexure 54 and clamping rings 71, 78 for the flexure 52 (FIG. 5). The clamping rings 71, 73, 75, 78 assist in mounting flexures 52, 54 since they are too thin to be screwed down directly without risk of damage. Clamping ring 78 also holds the bearing 80 and the seal 77 at the rotating portion of the assembly.

In the preferred embodiment, the stage assembly is provided with three leveling feet (one of which is shown in FIG. 4 at 90). The leveling feet allow the chuck to be set to the required height relative to the optics. In addition, the leveling feet allow the chuck to be leveled, or made parallel to the optics and at the same time make the chuck perpendicular to the axis of rotation of the rotational stage. A screw (not shown) passes through the center of each of the leveling feet to attach the Z-stage to the rotary stage.

In the preferred embodiment, the stage assembly is further provided with three damper assemblies (one of which is shown at 92). The damper assemblies provide critical damping to the mechanical "mass-spring" system, such that optimum closed-loop servo control is achieved.

The Z-axis motion system may operate as follows. To receive the wafer 4, the chuck 20 may be brought into a predetermined receiving position by having the processor apply an initial voltage to the PZT stack 38. After the wafer 4 has been placed on the chuck 20, a vacuum is communicated to the gap between wafer 4 and chuck 20 along the hose 74, the opening 76, central bore 19 and the grooves 81. Once the wafer 4 is secured to the chuck, the processor 112 controls one or more of the stages 22, 24, 26 to bring a predetermined measurement area of the wafer 4 within the range of the probe beam. The auto focus system 110 recognizes and communicates the offset between focal plane and the measurement area to the processor 112, which in turn adjusts the voltage correspondingly until the offset is substantially eliminated. In the preferred embodiment, the movement resolution and consequently the adjustment precision in vertical direction is within a range of 0.02–0.003 microns, depending upon particular elements incorporated into the feedback loop.

While the subject invention has been described with reference to a preferred embodiment, various changes and modifications could be made therein, by one skilled in the art, without varying from the scope and spirit of the subject invention as defined by the appended claims.

I claim:

1. A stage system for supporting a sample in a metrology device, comprising:

a chuck having an upper surface for supporting a wafer;

an axial actuator operationally coupled to the chuck for raising and lowering the chuck in a direction orthogonal to a plane of the upper surface; and a stage positioned to support said chuck, the stage including at least one flexure member coupling the chuck to the stage, such that tilting and lateral movement of the chuck, with respect to the stage, is significantly minimized while the chuck is being raised and lowered, the at least one flexure member including first and second annular membranes each coupling the chuck to the stage;

wherein each of said first and second annular membranes is substantially rigid in a direction in the plane of the respective annular membrane and flexible in a direction along a central axis of the respective annular membrane.

2. A stage system as recited in claim 1, further including a rotational driver operationally coupled to the stage for rotating the chuck about a central axis.

3. A stage system as recited in claim 1, further including two linear stages for moving the chuck along two orthogonal axes.

4. A stage system as recited in claim 1, wherein:
the stage has a rotatable drive section, and the first and second annular membranes are each operationally coupled between the rotatable drive section and the chuck.

5. A stage system as recited in claim 1, wherein said axial actuator includes a PZT element the length of which is adjustable in response to a drive voltage, and a lever element for transferring the changes in length of the PZT element to the chuck.

6. A stage system as recited in claim 5, further including a means for monitoring the position of the chuck and providing signals for adjusting the drive voltage to the PZT element.

7. A stage system for supporting a sample in a metrology device, comprising:
a chuck having an upper surface for supporting a wafer;
an axial actuator operationally coupled to the chuck for raising and lowering the chuck in a direction orthogonal to a plane of the upper surface; and
a stage positioned to support said chuck, the stage including at least one flexure member coupling the chuck to the stage, such that tilting and lateral movement of the chuck, with respect to the stare, is significantly minimized while the chuck is being raised and lowered, the at least one flexure member including first and second annular membranes each coupling the chuck to the stage;
wherein the first annular membrane has a different diameter than, and is positioned concentrically with respect to, said second annular membrane.

8. A stage system as recited in claim 7, further including a rotational driver operationally coupled to the stage for rotating the chuck about a central axis.

9. A stage system as recited in claim 7, further including two linear stages for moving the chuck along two orthogonal axes.

10. A stage system as recited in claim 7, wherein:
the stage has a rotatable drive section, and the first and second annular membranes are each operationally coupled between the rotatable drive section and the chuck.

11. A stage system as recited in claim 7, wherein said axial actuator includes a PZT element the length of which is adjustable in response to a drive voltage, and a lever element for transferring the changes in length of the PZT element to the chuck.

12. A stage system as recited in claim 11, further including a means for monitoring the position of the chuck and providing signals for adjusting the drive voltage to the PZT element.

13. A stage system for supporting a sample in a metrology device, comprising:
a chuck having an upper surface for supporting a wafer;
an axial actuator operationally coupled to the chuck for raising and lowering the chuck in a direction orthogonal to a plane of the upper surface; and
a stage positioned to support said chuck, the stage including at least one flexure member coupling the chuck to the stage, such that tilting and lateral movement of the chuck, with respect to the stage, is significantly minimized while the chuck is being raised and lowered, the at least one flexure member including first and second annular membranes each coupling the chuck to the stage;
wherein the first annular membrane is displaced vertically with respect to the second annular membrane.

14. A stage system as recited in claim 13, further including a rotational driver operationally coupled to the stage for rotating the chuck about a central axis.

15. A stage system as recited in claim 13, further including two linear stages for moving the chuck along two orthogonal axes.

16. A stage system as recited in claim 13, wherein:
the stage has a rotatable drive section, and the first and second annular membranes are each operationally coupled between the rotatable drive section and the chuck.

17. A stage system as recited in claim 13, wherein said axial actuator includes a PZT element the length of which is adjustable in response to a drive voltage, and a lever element for transferring the changes in length of the PZT element to the chuck.

18. A stage system as recited in claim 17, further including a means for monitoring the position of the chuck and providing signals for adjusting the drive voltage to the PZT element.

* * * * *